(12) United States Patent
Su et al.

(10) Patent No.: US 8,459,814 B2
(45) Date of Patent: Jun. 11, 2013

(54) WHITE-LIGHT EMITTING DEVICES WITH STABILIZED DOMINANT WAVELENGTH

(75) Inventors: Jung-Chieh Su, Taipei (TW); Siao-Fang Song, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 436 days.

(21) Appl. No.: 12/778,702

(22) Filed: May 12, 2010

(65) Prior Publication Data
US 2011/0279998 A1    Nov. 17, 2011

(51) Int. Cl.
*F21V 9/00* (2006.01)
(52) U.S. Cl.
USPC ................ 362/84; 362/293; 362/231; 257/96
(58) Field of Classification Search
USPC ............... 362/84, 293, 231, 2, 583, 510, 800, 362/34; 313/112, 501, 512; 257/98
See application file for complete search history.

(56) References Cited

U.S. PATENT DOCUMENTS

| | | | | |
|---|---|---|---|---|
| 5,813,753 A * | 9/1998 | Vriens et al. | | 362/293 |
| 5,962,971 A * | 10/1999 | Chen | | 313/512 |
| 6,833,565 B2 * | 12/2004 | Su et al. | | 257/98 |
| 7,800,287 B2 * | 9/2010 | Zheng et al. | | 362/293 |
| 8,147,092 B2 * | 4/2012 | Wu et al. | | 362/231 |
| 8,297,783 B2 * | 10/2012 | Kim | | 362/231 |
| 2010/0277887 A1 * | 11/2010 | Su et al. | | 362/19 |

OTHER PUBLICATIONS

Jung-Chieh Su, Siao-Fang Song, Hung-Shing Chen, "Chromaticity stability of phosphor-converted white light-emitting diodes with an optical filter", Applied Optics 2011, vol. 50, No. 2.

* cited by examiner

*Primary Examiner* — Bao Q Truong
(74) *Attorney, Agent, or Firm* — WPAT, PC; Justin King

(57) ABSTRACT

The disclosure provides a dominant wavelength stabilized white light emitting device and a method for stabilizing dominant wavelength of a white-light light emitting device. The light emitting device includes light-emitting diode chips, a phosphor resin layer disposed above the diode chip, and an optical filter disposed above the resin with a gap interposed between the phosphor resin layer and the optical filter. The phosphor resin layer contains a phosphor that is excited by light of the first wavelengths to emit light of second wavelengths. The optical filter reflects light of wavelength shorter than the peak wavelength and transmitting light of the second wavelengths with a modulated transmittance in a range of the first wavelengths.

15 Claims, 4 Drawing Sheets

WHITE-LIGHT EMITTING DEVICES WITH STABILIZED DOMINANT WAVELENGTH

This present invention relates to white-light emitting devices, and more particularly to white-light emitting devices using optical filter to provide dominant wavelength stability.

BACKGROUND OF THE INVENTION

A white-light emitting device (hereafter, LED) generally comprises of a blue-light LED combined with a yellow-light emitting $Y_3Al_5O_{12}:Ce^{3+}$ (hereafter, YAG:Ce) phosphor, that is excited by the blue light. Because of thermal effects resulting from the heat accumulation, the peak wavelength of the blue-light LED changes, and then the dominant wavelength and thereby the emission color of the white light shift. Moreover, the junction temperature of the blue LED rises as applied drive current increases, thus radiation power of the blue-light LED and conversion efficiency of the phosphor decrease.

SUMMARY OF THE INVENTION

It is, therefore, an object of the invention to obviate the drawbacks of the prior art and provide a method for stabilizing dominant wavelength of a white-light light emitting device.

To achieve the object, this invention present a method for stabilizing dominant wavelength of a white-light light emitting device, comprising: emitting light of first wavelengths; exciting phosphor by light of the first wavelengths to emit light of second wavelengths; and applying an optical filter to reflect light of wavelength shorter than the peak wavelength of the first wavelengths and transmit light of the second wavelengths with an modulated transmittance in a range of the first wavelengths.

A portion of light of first wavelength emitted from LED chips excite the phosphor, and the residue light of first wavelength combine with the emission light of second wavelength to form white light which propagate through the resin layers and the filter. Based on optical principle and transmittance spectrum of the optical filter, the portion of light of first wavelength impinge on the filter from the air gap and multiple reflected back to re-excite the phosphor resin layer. The combination of the first excited and re-excited phosphor emission light of second wavelength will stabilize the dominant wavelength of the emission white light. Meanwhile the problematic color shift and excess color temperature can be solved. This mechanism is taken advantage in this invention to stabilize the dominant wavelength of white-light emission.

It is another object of the invention to provide a white-light light emitting device of lower color temperature and illumination uniformity.

To achieve the object, this invention present a white-light LED comprised of light-emitting diode chips, a phosphor resin layer disposed above the diode chip, and an optical filter disposed above the resin with a gap interposed between the phosphor resin layer and the optical filter. Because that a portion of light of first wavelength emitted from LED chips combine with the emission light of second wavelength to form white light. As transmitting through the filter, the power of the remaining light of first wavelength depends on the transmittance spectrum of filter. For the light with wavelengths shorter than the peak wavelength of first wavelength emission band, there are secondary emission resulted from the multiple reflection and re-excitation of the phosphor resin layer according to the reflectance spectrum of the filter. On this aspect, the reflected light of first wavelength excites the phosphor with the wavelengths less than the peak wavelength of excitation LED. According to the experimental data, the fact, that the reflected light with shorter first wavelength re-excite secondary emission of excited phosphor with longer second wavelength. For the first wavelength of excitation LED chips, the above effect would stabilize the red shift of dominant wavelength caused by the blue shift of band filling and red shift of band gap narrowing, which are resulted from the high drive current density and LED junction temperature increasing, respectively.

DESCRIPTION OF THE EXEMPLARY EMBODIMENTS

Figure 1:
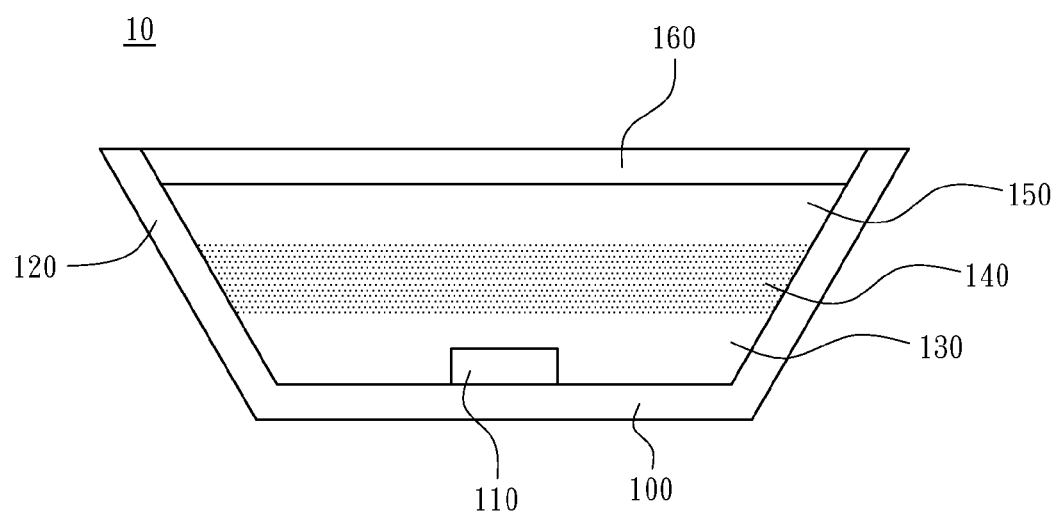
FIG. 1 is a diagrammatic view of an embodiment of the invention.

Referring to FIG. 1 with greater particularity, the white light LED structure of a first embodiment of the invention is shown, where a light emitting device 10 having a cup-shaped housing 100 that have a reflector coating 120 applied to the inner wall thereof. A blue LED chip 110 that emits light of first wavelengths is positioned at the bottom of the cup-shaped housing 100. One or more resin layers are disposed above the blue LED chip, and one of which containing phosphor to emit light of second wavelengths when excited by light of the first wavelengths. In this embodiment a transparent resin 130 overlays the blue LED chip 110, and a phosphor resin layer 140 overlays the transparent resin layer 130. An optical filter 160 is disposed above the resins with a gap 150 interposed between the resin layers and the optical filter. The filter 160 reflects light of wavelength shorter than the peak wavelength of the first wavelengths and transmitting light of the second wavelengths with a modulated transmittance in a range of the first wavelengths. The light of first wavelengths emitted by the light-emitting diode chip 110 excited the phosphor in the phosphor resin layer 140 to emit the light of second wavelengths, which then passes through the optical filter 160. Because that the portion of light of first wavelength emitted from light-emitting diode chip 110 combine with the emission light of second wavelength to form white light. As transmitting through the filter 160, the light intensity of the residue light of first wavelength depends on the transmittance spectrum of filter 160. For the light with wavelengths shorter than the peak wavelength of first wavelength emission band, there are secondary emission resulted from the multiple reflection and re-excitation of the phosphor resin layer 140 according to the reflectance spectrum of the filter 160. On this aspect, the reflected light of first wavelength excite the phosphor resin layer with the wavelengths less than the peak wavelength of the light-emitting diode chip 110.

Preferably the phosphor resin layer 140 is comprised of the phosphor YAG:Ce, and the first wavelengths emitted by the blue-light emitting diode chip 110 are from 410 nm to 510 nm. When YAG:Ce is activated by blue-light LEDs of various peak wavelengths, the emission spectra thereof shift also.

Figure 2:
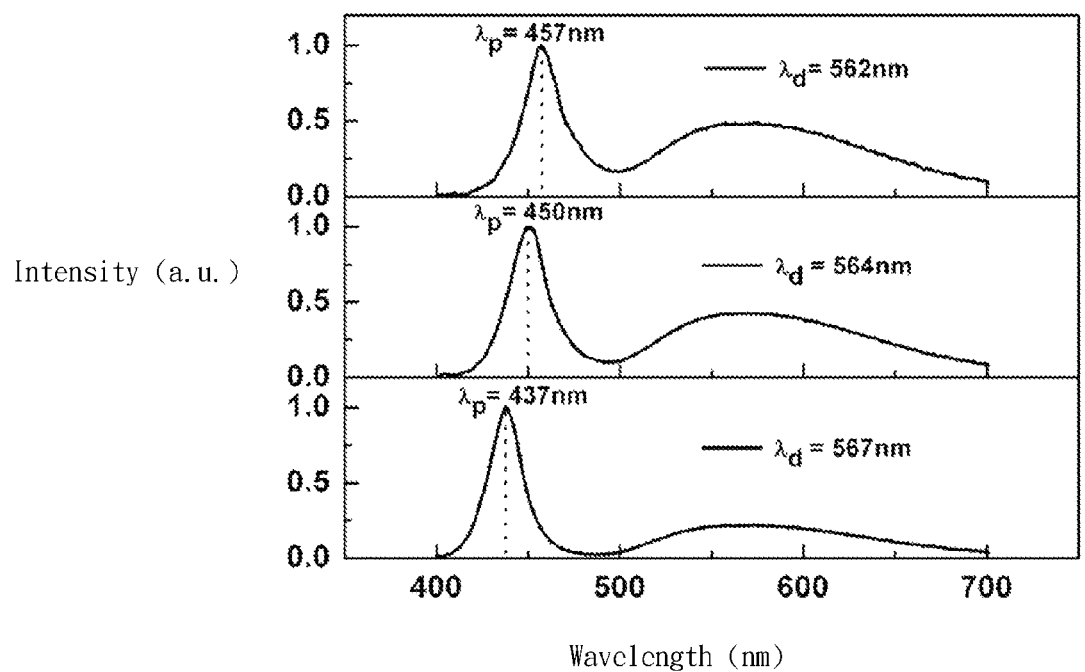
FIG. 2 is the emission spectra of YAG:Ce excited by various peak wavelength of blue emission.

FIG. 2 shows the emission spectra of YAG:Ce excited by various peak-wavelength blue emission. The peak wavelengths 457 nm, 450 nm, and 437 nm of blue emission are converted to peak wavelengths of 562 nm, 564 nm, and 567 nm by YAG:Ce, respectively. It can be inferred that shorter wavelength blue emission excited longer wavelength for yellow phosphor emission (or red-shift effect). Such an effect causes that the reflected light of the first wavelengths has shorter wavelengths, and thereby the secondary light emission excited by the reflected light of first wavelength has longer wavelengths.

As the applied drive current increases, there are two effects for the peak wavelength of blue excitation LED: One is the blue shift caused by band filling of excess drive current, and the other is the red shift caused by the band gap narrowing resulted from the increasing temperature. As mentioned data in the last paragraph, the blue light of shorter wavelengths excite the YAG:Ce phosphor emission of longer second wavelengths, i.e. red shift. The two effects compete with each other as increasing current density, but both effects result in red shift of dominant wavelength of phosphor emission of second wavelength. The red-shift effect caused by the band filling is less than that of band gap narrowing caused by the increasing temperature which dominates at larger drive current density. Meanwhile the optical filter 160 reflects the blue light of shorter wavelengths to re-excite the YAG:Ce phosphor emission of longer second wavelengths, this complement the red shift caused by the band filling effect at less drive current density. The temperature, current and filter effect on white light emission spectra can compensate each other in certain current range; thus the stability of dominant wavelength of white light emission is accomplished by the optical filter 160 with designate transmittance spectrum.

Preferably, the optical filter 160 has a transmittance of less than about 3% at wavelengths from about 350 nm to about 440 nm, a transmittance of greater than about 80% at wavelengths from about 480 nm to about 700 nm, and an increasing transmittance of from about 3% at wavelengths of about 440 nm to about 80% at wavelengths of about 480 nm.

A preferred form of the optical filter 160 is comprised of alternating layers of a high refractive-index material and a low refractive-index material. The high refractive-index material is preferably selected from $TiO_2$, $Ta_2O_5$, $ZrO_2$, ZnO, $Nd_2O_3$, $Nb_2O_5$, $In_2O_3$, $SnO_2$, $SbO_3$, $HfO_2$, $CeO_2$, and ZnS; and the low refractive-index material is preferably selected from $SiO_2$, $Al_2O_3$, MgO, $La_2O_3$, $Yb_2O_3$, $Y_2O_3$, $Sc_2O_3$, $WO_3$, LiF, NaF, $MgF_2$, $CaF_2$, $SrF_2$, $BaF_2$, $AlF_3$, $LaF_3$, $NdF_3$, $YF_3$, and $CeF_3$. More preferably, the optical filter 160 is comprised of alternating layers of $TiO_2$ and $SiO_2$. The layers can be deposited by conventional techniques such as chemical vapor deposition or sputtering. Moreover, the gap 150 between the resins and the filter can be filled with material having refractive index thereof close or equal to 1, such as air or silica aerogel.

Figure 3:
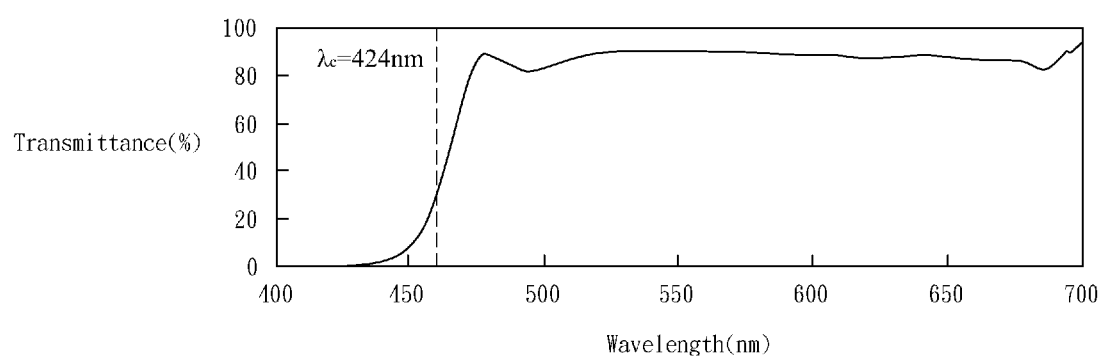
FIG. 3 is the measured transmittance spectrum of the filter N5 according to an aspect of the invention
Figure 4:
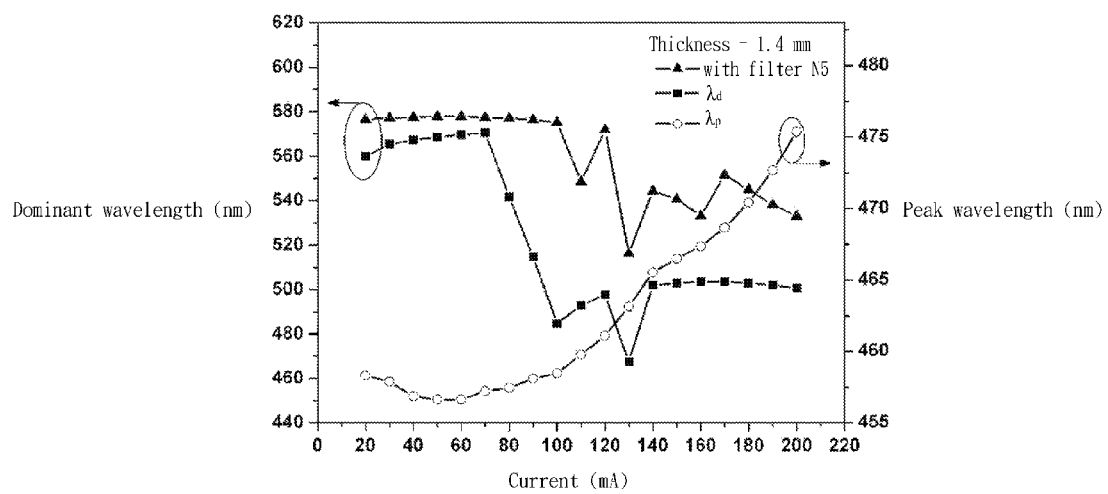
FIG. 4 is the peak wavelengths of the blue excitation LED and the dominant wavelength of white light emission, with and without the filter N5 as a function of drive current; according to an aspect of the invention.

To take the sample N5 as an example, the transmittance spectrum in visible wavelengths is shown in FIG. 3, with a transmittance of less than 3% at wavelengths from about 350 nm to about 440 nm, a transmittance of greater than 80% at wavelengths from about 480 nm to about 700 nm, an increasing transmittance of from about 3% at wavelengths of about 440 nm to about 80% at wavelengths of about 480 nm, and a transmittance of about 22% at the peak wavelength 458 nm of a blue-light LED. The phosphor resin layer has a thickness of 1.4 mm in this example. FIG. 4 compares the peak wavelengths of the blue-light LED and the YAG:Ce converting yellow light with and without the optical filter as a function of the LED drive current. Before the filter is applied to the LED, as the drive current increases, the junction temperature of the blue-light LED increases. The wavelength shift range of peak wavelengths of the blue emission is from 455 nm to 476 nm, and then the red-shift range of dominant wavelength of the corresponding white light emission is from 560 nm to 580 nm. As the drive current is higher than 80 mA, the dominant wavelength of the white light emission drops dramatically, which is caused by the excess light intensity of blue emission. However, the dominant wavelength of white light emission does not drop until the drive current is higher than 120 mA in the case of the optical filter applied. The results verify the capacity of the optical filter in dominant wavelength stability of white-light emission, without any additional thermal management.

What is claimed is:

1. A method for stabilizing dominant wavelength of a white-light light emitting device, comprising:
   emitting blue light with a first peak wavelength;
   exciting phosphor by the blue light with the first peak wavelength to emit yellow light with a second peak wavelength;
   applying an optical filter with a decreasing transmittance of from about 80% at wavelengths of about 480 nm to about 3% at wavelengths the of about 440 nm so as to reflect a part of the blue light with wavelengths shorter than the first peak wavelength and transmit the yellow light with the second peak wavelength; and
   re-exciting the phosphor by the part of reflected blue light from the optical filter to emit yellow light with a third peak wavelength different from the second peak wavelength.

2. The method of claim 1, wherein the blue light with the first peak wavelength has wavelengths ranging from 410 nm to 510 nm, and the phosphor is selected from YAG:Ce, TAG:Ce, and yellow orthosilicate.

3. The method of claim 1, wherein the optical filter has a transmittance of less than 3% at wavelengths from about 350 nm to about 440 nm, a transmittance of greater than 80% at wavelengths from about 480 nm to about 700 nm, and a transmittance of about 22% at 458 nm.

4. The method of claim 1, wherein the optical filter is comprised of alternating layers of a high refractive-index material and a low refractive-index material.

5. The method of claim 4, wherein the high refractive-index material is selected from $TiO_2$, $Ta_2O_5$, $ZrO_2$, ZnO, $Nd_2O_3$, $Nb_2O_5$, $In_2O_3$, $SnO_2$, $SbO_3$, $HfO_2$, $CeO_2$, and ZnS.

6. The method of claim 4, wherein the low refractive-index material is selected from $SiO_2$, $Al_2O_3$, MgO, $La_2O_3$, $Yb_2O_3$, $Y_2O_3$, $Sc_2O_3$, $WO_3$, LiF, NaF, $MgF_2$, $CaF_2$, $SrF_2$, $BaF_2$, $AlF_3$, $LaF_3$, $NdF_3$, $YF_3$, and $CeF_3$.

7. The method of claim 4, wherein the optical filter is comprised of alternating layers of $TiO_2$ and $SiO_2$.

8. A dominant wavelength stabilized white light emitting device, comprising:
   a light emitting diode chip, emitting blue light with a first peak wavelength;
   a phosphor resin layer disposed above the light emitting diode chip, wherein the phosphor resin layer is excited by the blue light with the first peak wavelength to emit yellow light with a second peak wavelength; and
   an optical filter, having a decreasing transmittance of from about 80% at wavelengths of about 480 nm to about 3% at wavelength the of about 440 nm, the optical filter disposed above the phosphor resin layer with a gap interposed between the phosphor resin layer and the optical filter, wherein the gap is filled with a material of refractive index close or equal to 1, so that the optical filter reflects a part of blue light with wavelengths shorter than the first peak wavelength, and the part of reflected blue light re-excites the phosphor resin layer to emit yellow light with a third peak wavelength different from the second peak wavelength.

9. The light emitting device of claim 8, wherein the blue light with the first peak wavelength has wavelengths ranging from 410 nm to 510 nm, and the phosphors is selected from YAG:Ce, TAG:Ce, and yellow orthosilicate.

10. The light emitting device of claim 8, wherein the optical filter has a transmittance of less than 3% at wavelengths from about 350 nm to about 440 nm, a transmittance of greater than 80% at wavelengths from about 480 nm to about 700 nm, and, and a transmittance of about 22% at 458 nm.

11. The light emitting device of claim 8, wherein the optical filter is comprised of alternating layers of a high refractive-index material and a low refractive-index material.

12. The optical filter of claim 11, wherein the high refractive-index material is selected from $TiO_2$, $Ta_2O_5$, $ZrO_2$, $ZnO$, $Nd_2O_3$, $Nb_2O_5$, $In_2O_3$, $SnO_2$, $SbO_3$, $HfO_2$, $CeO_2$, and $ZnS$.

13. The optical filter of claim 11, wherein the low refractive-index material is selected from $SiO_2$, $Al_2O_3$, $MgO$, $La_2O_3$, $Yb_2O_3$, $Y_2O_3$, $Sc_2O_3$, $WO_3$, $LiF$, $NaF$, $MgF_2$, $CaF_2$, $SrF_2$, $BaF_2$, $AlF_3$, $LaF_3$, $NdF_3$, $YF_3$, and $CeF_3$.

14. The light emitting device of claim 11, wherein the optical filter is comprised of alternating layers of $TiO_2$ and $SiO_2$.

15. The light emitting device of claim 8, wherein the gap is filled with air or silica aero gel.

* * * * *